(12) United States Patent
Lee

(10) Patent No.: US 6,979,990 B2
(45) Date of Patent: Dec. 27, 2005

(54) REFERENCE VOLTAGE GENERATOR FOR FREQUENCY DIVIDER AND METHOD THEREOF

(75) Inventor: Heung-bae Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/867,704

(22) Filed: Jun. 16, 2004

(65) Prior Publication Data

US 2004/0263143 A1    Dec. 30, 2004

(30) Foreign Application Priority Data

Jun. 16, 2003 (KR) .................... 10-2003-0038680

(51) Int. Cl.[7] .............................. G05F 3/16
(52) U.S. Cl. ..................... 323/316; 323/314
(58) Field of Search .............. 323/311–316; 327/539

(56) References Cited

U.S. PATENT DOCUMENTS

| | | | | |
|---|---|---|---|---|
| 5,614,816 A | * | 3/1997 | Nahas | 323/316 |
| 5,856,742 A | * | 1/1999 | Vulih et al. | 323/315 |
| 6,563,295 B2 | * | 5/2003 | Juang | 323/315 |
| 6,570,436 B1 | * | 5/2003 | Kronmueller et al. | 327/538 |

* cited by examiner

*Primary Examiner*—Gary L Laxton
(74) *Attorney, Agent, or Firm*—Lee & Morse, P.C.

(57) ABSTRACT

A reference voltage generator, and a method thereof, supplies a reference voltage to a device that decides between first and second output levels based on the reference voltage. The reference voltage generator includes a reference current unit through which a reference current flows and a replica unit. An input terminal of the replica unit is connected to the reference current unit. An output terminal of the replica unit is connected to the device. The replica unit includes a replica circuit replicating a circuit in the device that decides the first output level. The replica unit multiplies the first output level from the replicated circuit in response to the reference current by a predetermined ratio and outputs the result as the reference voltage to the device.

16 Claims, 4 Drawing Sheets

REFERENCE VOLTAGE GENERATOR FOR FREQUENCY DIVIDER AND METHOD THEREOF

BACKGROUND OF THE INVENTION

1. Field of the Invention

The present invention relates to a reference voltage generator for a device, e.g., a frequency divider, and a method of supplying a reference voltage. More particularly, the present invention relates to a reference voltage generator that generates a reference voltage to be applied to the device and a method of supplying a reference to the device.

2. Description of the Related Art

Generally, a frequency synthesizer used in a radio frequency (RF) system is used to lock a local oscillation frequency output from a voltage controlled oscillator (VCO) to a selected channel frequency. Typically, a frequency synthesizer is constructed with a phase locked loop (PLL).

FIG. 1 is a block diagram of a PLL. The PLL of FIG. 1 includes a phase detector (PD) 10, a charge pump 11, a loop filter 12, a VCO 13, a pre-scaler 14, and a frequency divider 15.

The PD 10 detects the phases of a reference frequency and a frequency output from the frequency divider 15 and outputs a pulse corresponding to a difference between the phases. The charge pump 11 outputs charges to a capacitor (not shown) in the loop filter 12 corresponding to a width of a positive pulse output from the PD 10 or receives charges corresponding to a width of a negative pulse from the capacitor. The loop filter 12 discharges/accumulates electric charges to/from the charge pump 11 to control a voltage. The loop filter 12 generally includes a low-pass filter for performing low-pass filtering to output a low frequency component of voltage. The VCO 13 outputs a specific frequency according to a voltage received from the loop filter 12. The pre-scaler 14 divides an output frequency of the VCO 13 by one of two fixed ratios and outputs a frequency lower than the frequency output by the VCO 13. The division ratio of the pre-scaler 14 is dependent on a mode control signal. The divider 15 divides a frequency output from the pre-scaler 14 so that the divided frequency output from the divider 15 is substantially the same as the reference frequency, and outputs the divided result to the PD 10.

In more detail, the pre-scaler 14 may include a 4/5 synchronous divider (shown in FIG. 2) and an 8 asynchronous divider (not shown). As shown in FIG. 2, the 4/5 synchronous divider is constructed by cascading a plurality of D flip-flops (DFFs). As seen in FIG. 2, the 4/5 synchronous divider includes a first DFF 21, a first NOR gate 20 that supplies an input signal to the first DFF 21, a second DFF 22, a third DFF 24, and a second NOR gate 23 that supplies an input signal to the third DFF 24. The first through third DFFs 21, 22, 24, each receive a clock signal CK and an inverted clock signal CKB. A reference voltage (DBIAS) is provided to the first DFF 21 and the third DFF 24.

An output signal of a terminal Q of the second DFF 22 and an output signal of a terminal QB of the third DFF 24 are supplied as input signals to the first NOR gate 20. Also, an output signal of a terminal QB of the second DFF 22 and a mode control signal MC are supplied as input signals to the second NOR gate 23. The first DFF 21 outputs a divided-by-two signal for each clock cycle and the second DFF 22 outputs a divided-by-four signal for each clock cycle. The third DFF 24 maintains the output signal of the second DFF 22 while the mode control signal MC is high, and performs division-by-five when the mode control signal MC is low.

When a DFF serves to directly receive and divide a signal in the GHz band, such a DFF may not be implemented with complementary metal-oxide semiconductor (CMOS) logic gates. Instead, a DFF for use in this frequency band may be implemented using current mode logic (CML).

CML is a logic gate implemented using a differential amplifier pair. Since a reference voltage (DBIAS) of a CML is set so that the amplitude of a signal can be kept constant, a CML can operate at a very high speed. Such a DFF allows an edge trigger operation by cascading two D-latches each implemented with CML in a cascade form so that the two D-latches act as a master and a slave, respectively.

However, when changes occur in a manufacturing process due to manufacturing tolerances, the characteristics of CML and resistors constructing CML are altered. For example, the resistances of the resistors may be changed by up to 20%. A DFF output voltage may also get changed, since the reference voltage DBIAS supplied to a DFF cannot follow changes in the amplitude of an input signal because the reference voltage DBIAS is a fixed value.

SUMMARY OF THE INVENTION

The present invention is therefore directed to a reference voltage generator for a device, such as a frequency divider, and a method thereof, which substantially overcomes one or more of the problems due to the limitations and disadvantages of the related art.

It is a feature of an embodiment of the present invention to provide a reference voltage generator and method thereof that is capable of changing the level of a reference voltage supplied to a device, such as a frequency divider, according to changes in the amplitude of an input signal. It is another feature of an embodiment of the present invention to maintain the reference voltage at an intermediate value of an input signal. It is yet another feature of an embodiment of the present invention to ensure proper operation of the device by providing an appropriate reference voltage thereto.

At least one of the above and other features and advantages of the present invention may be realized by providing a reference voltage generator, which supplies a reference voltage to a device that decides first and second output levels according to input signals according to the reference voltage and latches the decided first and second output levels. The reference voltage generator includes a reference current unit through which a reference current flows and a replica unit. An input terminal of the replica unit is connected to the reference current unit. An output terminal of the replica unit is connected to the device. The output terminal includes a replicated circuit that replicates a circuit in the device that decides the first output level. The replica unit multiplies the first output level from the replicated circuit output in response to the reference current by a predetermined ratio and outputs a result as the reference voltage to the device. The predetermined ratio may be less than one, e.g., 1/2.

The reference current unit may include a current controller for receiving a predetermined voltage and for outputting a current value, a current mirror, a first side of the current mirror being connected to the current controller, and a first transistor including a drain terminal, a source terminal, and a gate terminal. The drain terminal is connected to the gate terminal and to a second side of the current mirror, and the current value flows into the drain terminal.

The current controller may include an operational amplifier having a plus terminal and a minus terminal. The operational amplifier receives the predetermined voltage through the plus terminal and amplifies a voltage difference between the plus terminal and the minus terminal. The current controller may further include a second transistor including a drain terminal, a source terminal, and a gate terminal, wherein the second transistor turns on/off according to an output from the operational amplifier and wherein the gate terminal is connected to the operational amplifier, the drain terminal is connected to the current mirror, and the source terminal is connected to the minus terminal of the operational amplifier. The current controller may also include a resistor connected to the source terminal of the second transistor.

The replica circuit may include a fourth transistor including a drain terminal, a source terminal, and a gate terminal. The source terminal of the fourth transistor is grounded, the gate terminal of the fourth transistor is connected to the gate terminal of the first transistor and a gate terminal of a third transistor located at a corresponding gate position to the fourth transistor in the circuit within the device. The replica circuit may further include fifth and sixth transistors, each including a drain terminal, a source terminal, and a gate terminal, wherein the fifth and sixth transistors are connected in series to the drain terminal of the fourth transistor. Each gate terminal of the fifth and sixth transistors may be connected to a voltage which enables the fifth and sixth transistors to be turned on. The replica unit may also include two resistors, which are connected in series to a non-connected drain terminal between the fifth and the sixth transistors, the two resistors for dividing the first output level from the replicated circuit by an inverse of the predetermined ratio.

At least one of the above and other features and advantages may be realized by supplying a reference voltage to a device, which decides first and second output levels to input signals according to the reference voltage and latches the decided first and the second output levels. The supplying includes setting a reference current, replicating a circuit of the device that decides the first output level from the device, thereby forming a replicated circuit, replicating the reference current, thereby outputting a replicated reference current, supplying the replicated reference current to the replicated circuit, and multiplying the first output level from the replicated circuit by a predetermined ratio and supplying a result as the reference voltage to the device. The predetermined ratio may be less than one, e.g., 1/2.

The setting the reference current may include controlling a current value using a predetermined voltage, thereby outputting a controlled current value, replicating the controlled current value through a current mirror, and connecting a drain terminal to a gate terminal and the current mirror, using a transistor including the drain terminal, a source terminal, and the gate terminal, so that the replicated current flows to the transistor.

The replicating the reference current and flowing the replicated current to the replicated circuit may be performed by connecting the replicated circuit to the gate terminal of the transistor.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Korean Patent Application No. 2003-38680, filed on Jun. 16, 2003, in the Korean Intellectual Property Office, and entitled "Reference Voltage Generator and Frequency Divider and Method Thereof," is incorporated by reference herein in its entirety.

Figure 1:
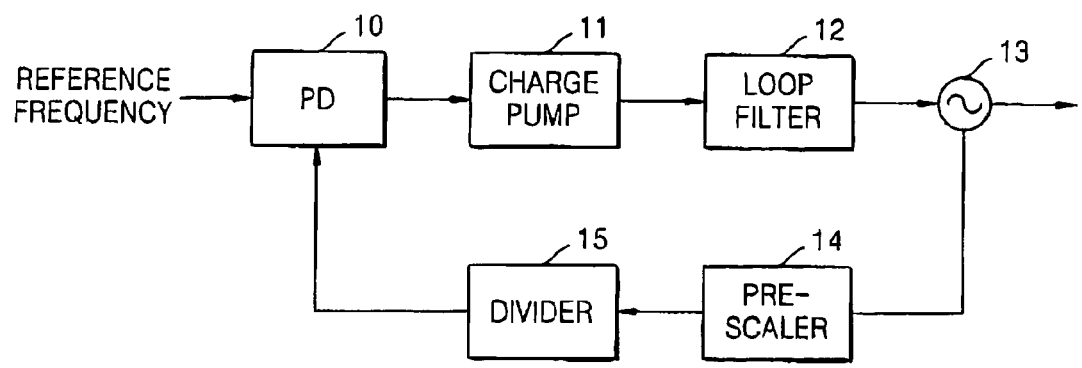
FIG. 1 is a block diagram of a general phase locked loop (PLL)
Figure 2:
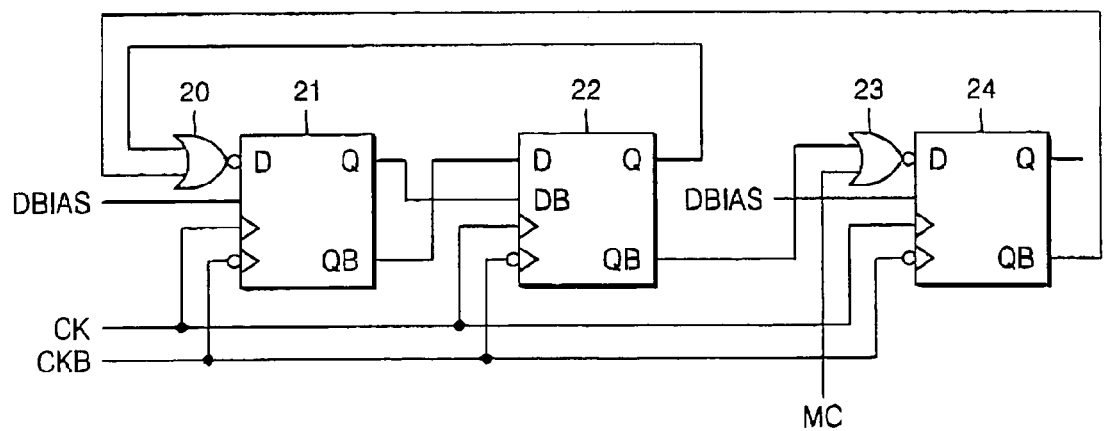
FIG. 2 is a block diagram of a general 4/5 divider.
Figure 3:
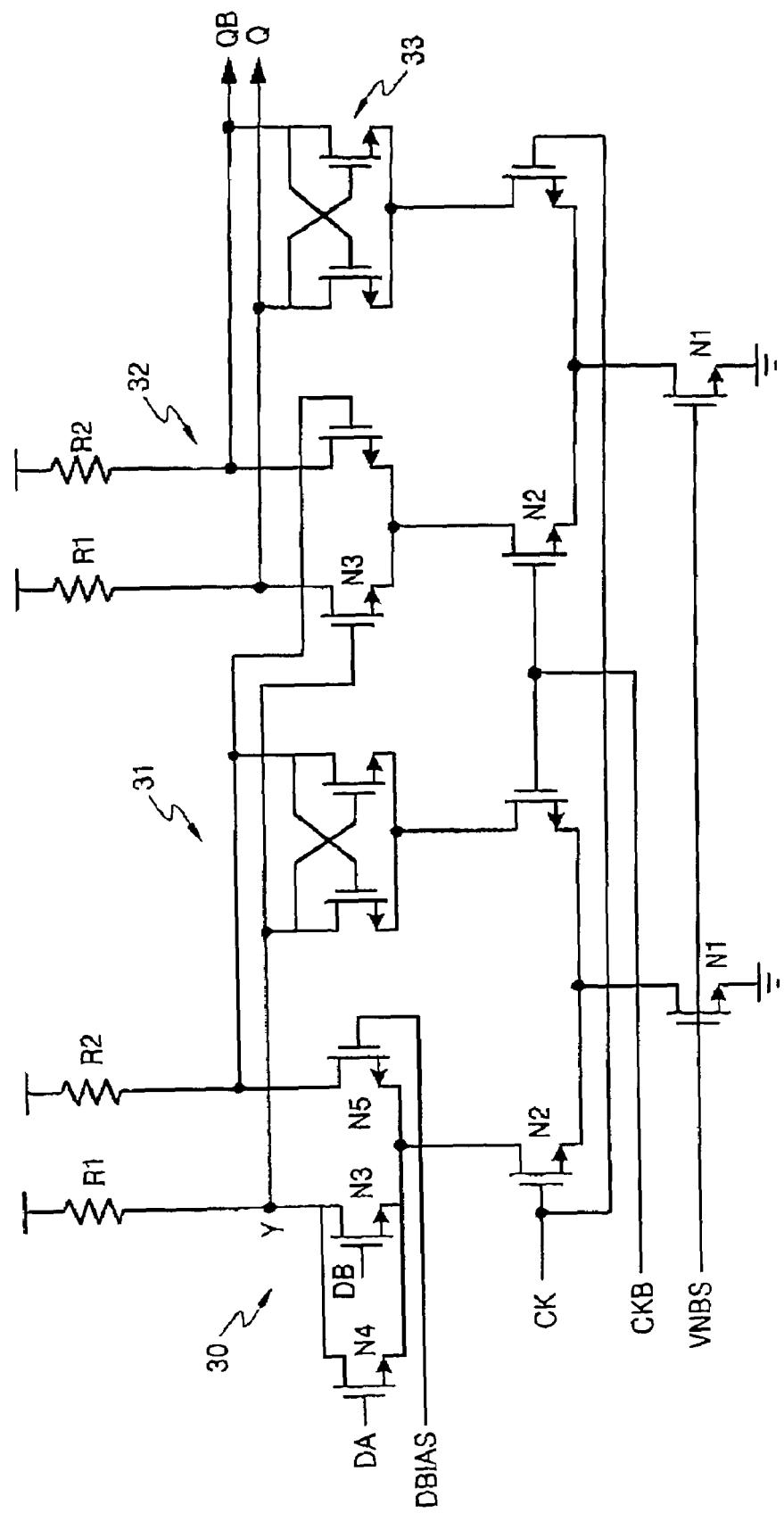
FIG. 3 is an internal circuit diagram of a CML DFF in which a NOR gate is connected to an input terminal.

The present invention will now be described more fully hereinafter with reference to the accompanying drawings, in which embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout FIG. 3 is an internal circuit diagram of a CML DFF in which a NOR gate is connected to an input terminal. The CML DFF of FIG. 3 includes four stages 30, 31, 32, and 33. The CML DFF decides first and second output levels to input signals DA and DB according to the reference voltage DBIAS and latches the decided first and second output levels to be output as output signals Q and QB.

The first and third stages 30 and 32 are differential amplifiers, each of which receives a gate voltage VNBS as an input signal, and the second and fourth stages 31 and 33 are latches. Only the elements used in connection with the reference voltage generator of the present invention are labeled and described in detail for clarity. The remaining stages/elements are clearly shown in FIG. 3 and a detailed discussion thereof will be omitted.

The first stage 30 includes NMOS transistors N1–N5. NMOS transistors N3 and N4, receiving input signals DB and DA, respectively, form a NOR gate. NMOS transistor N5, together with the NOR gate, forms a differential amplifier and receives a reference voltage DBIAS as a gate voltage. NMOS transistor N2 is connected to a clock signal CK. NMOS transistor N1 is connected to ground.

The operations of the first and the fourth stages 30 and 33 and the operations of the second and the third stages 31 and 32 are dependent on the clock signal CK and an inverted clock signal CKB, respectively. Accordingly, an output signal from the NOR gate and an output signal from the NMOS transistor N5 are propagated and output finally as output signals Q and QB, respectively, at the fourth stage 33.

In the above-described configuration of the DFF, the operation of the first stage 30 to which a reference voltage DBIAS is supplied will be described in detail as follows.

Figure 4A:
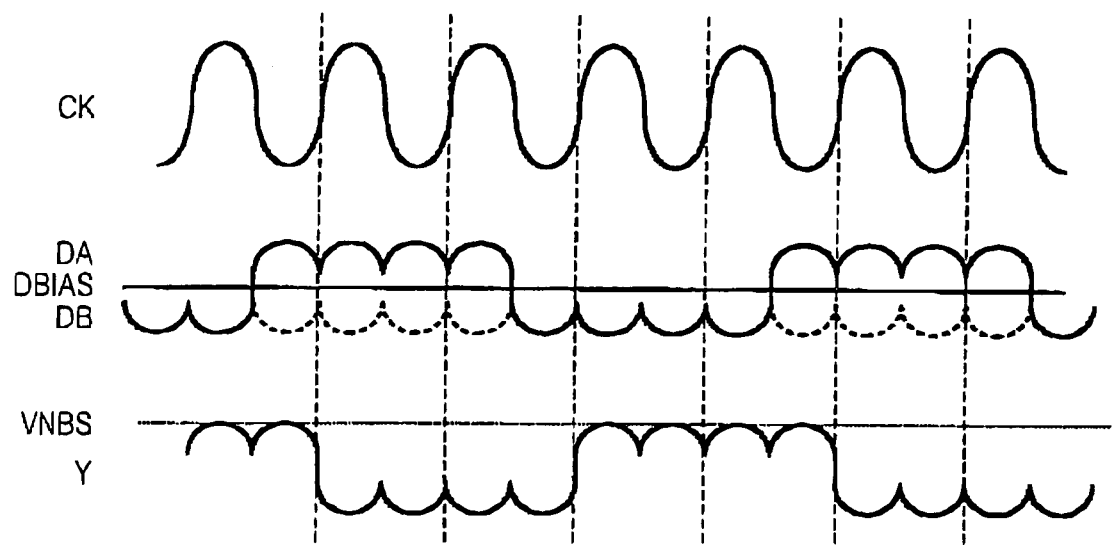
FIG. 4A is a timing diagram of signals produced during the operation of a first stage of FIG. 3.

FIG. 4A is a timing diagram of signals produced during the operation of the first stage 30 of FIG. 3. DA and DB indicate input signals of the NOR gate and DBIAS indicates the reference or gate voltage of the NMOS transistor N5. Y indicates an output signal of the NOR gate.

As shown in FIG. 4A, if both a signal VNBS and the clock signal CK are high, the NMOS transistors N1 and N2 are turned on. If both the input voltages DA and DB are low, the output signal Y remains high. If the clock signal CK is low and the input signals DA and DB are high and low, respectively, the output signal Y remains high. If the clock signal CK is changed to a high level and the input signals DA and DB remain high and low, respectively, the output signal Y is changed to a low level. If the clock signal CK is changed again to a low level and the input signals DA and DB remain high and low, respectively, the NMOS transistor N2 is turned off and the second stage 31 is turned on, thereby keeping the output signal Y low.

Figure 4B:
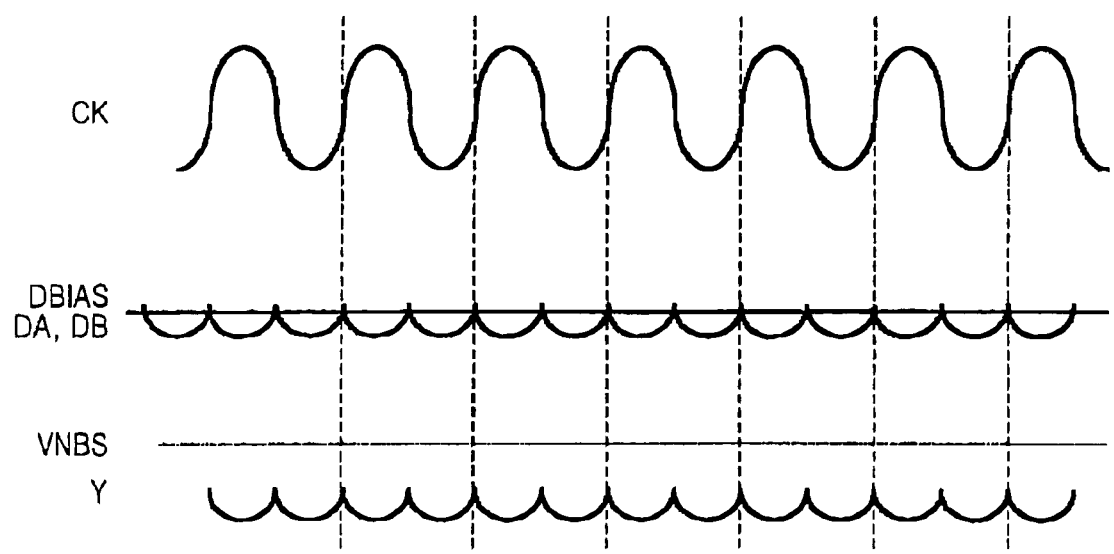
FIG. 4B is a timing diagram of signals produced during the operation of the first stage of FIG. 3 when changes in a manufacturing process alter a voltage output from the first stage from an expected voltage.

Referring to FIG. 4A, in a normal case, the input signals DA and DB have constant amplitudes centering on the reference voltage DBIAS. Accordingly, the output signal Y of the NOR gate has a distinctly distinguishable level. However, when changes occur in a manufacturing process due to manufacturing tolerances, the structure of the CML DFF may deviate from a desired structure. Such deviation may result in voltages output by the CML DFF being different from the expected voltages. This difference may result in the output signal Y following a half-period of an input signal in its high or low interval of an input signal due to the altered structure of the CML DFF, thereby generating ripple noise as shown in FIG. 4B. If the amplitude of the output signal is reduced due to changes in a manufacturing process, the difference between the output signal and the reference voltage DBIAS is reduced and errors are generated at rising edges of the clock signal due to the ripple noise. The ripple noise prevents the waveform of a final output signal from being correctly divided.

In more detail, in a case of the 4/5 divider, since DFFs are cascaded, output signals at the terminals Q and QB of each DFF are input to the following DFF. As a result, the amplitude of an output signal of a DFF is the same as the amplitude of an input signal of the following DFF.

In a NOR-integrated type DFF, it is important that a NOR operation is performed with the input signals DA and DB compared with the reference voltage DBIAS. For example, if the input signals DA and DB have voltages lower than the reference voltage DBIAS, the output signal Y is changed to a high level. Therefore, to perform a stable operation, the reference voltage DBIAS needs to be set to an intermediate value of the voltage of the input signal, i.e., a value between the input signals DA and DB, as shown in FIG. 4A.

Accordingly, the present invention replicates a predetermined portion of the CML DFF and uses the replicated portion as a reference voltage generator, instead of supplying a reference voltage DBIAS with a fixed value to the device from an external source.

Figure 5:
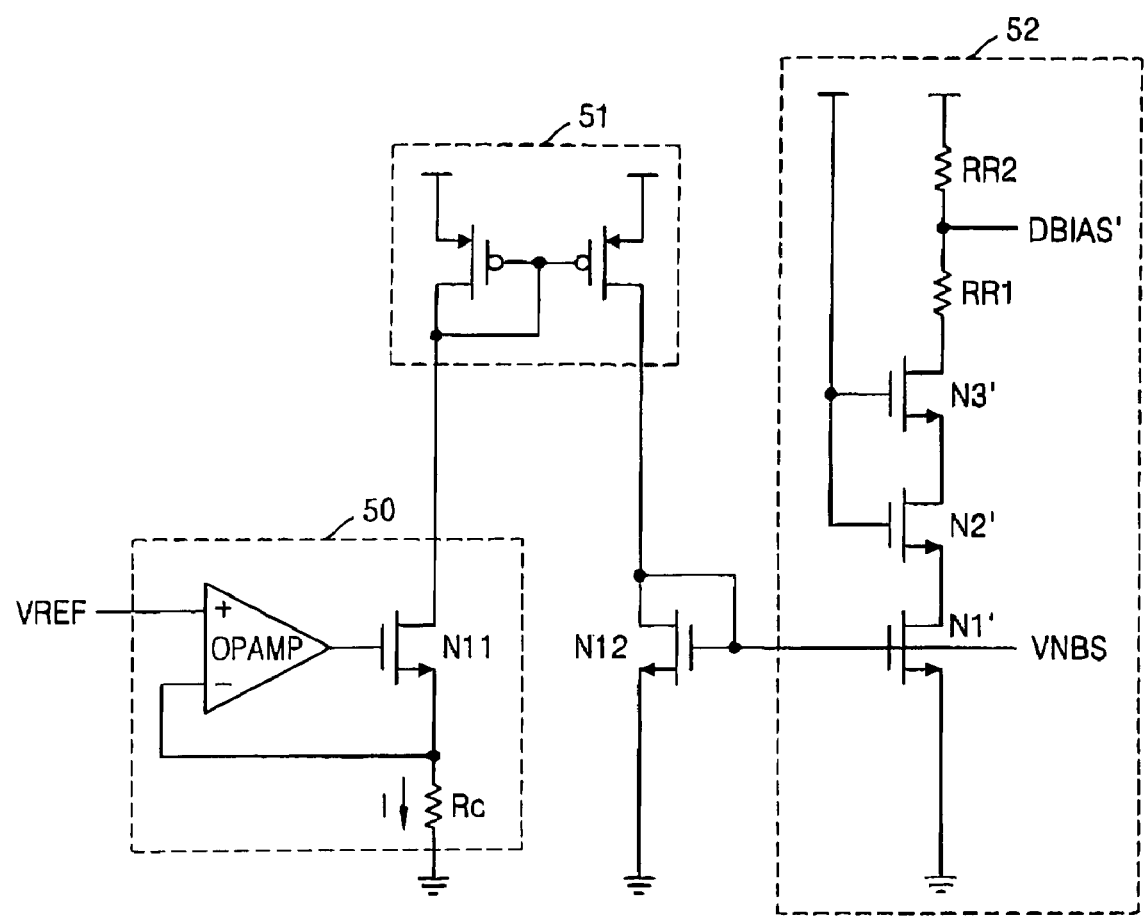
FIG. 5 is a circuit diagram of a reference voltage generator according to the present invention.

FIG. 5 is a circuit diagram of a reference voltage generator according to the present invention. The reference voltage generator of FIG. 5 includes a current controller 50, a current mirror unit 51, an NMOS transistor N12, and a replica unit 52.

The current controller 50 includes an operational amplifier (OPAMP), an NMOS transistor N11 connected to an output of the OPAMP, and a resistor Rc connected to a source terminal of the NMOS transistor N11.

The OPAMP includes a plus terminal receiving a reference voltage VREF and a minus terminal connected to the source terminal of the NMOS transistor N11. A current value I is dependent on a resistance of the resistor Rc and an internal resistance of the NMOS transistor N11 operated according to an output signal of the OPAMP.

The current mirror unit 51 replicates the current I flowing from a drain terminal of the NMOS transistor N11 and the resistor Rc, and is connected to a drain terminal of the NMOS transistor N12, thus allowing the replicated current I to flow through the NMOS transistor N12. Further, the drain terminal of the NMOS transistor N12 is connected to a gate terminal of the NMOS transistor N12.

The replica unit 52 includes a replicated circuit of the first stage 30 of the CML DFF of FIG. 3 receiving the reference voltage DBIAS, which includes the NMOS transistors N3, N1, N2. In particular, the replicated circuit includes NMOS transistors N3', N2', N1'. The NMOS transistors N2' and N3' are connected in series to a drain terminal of the NMOS transistor N1'. Each gate terminal of the NMOS transistors N2' and N3' are connected to a voltage which turns them ON. Two resistors RR1 and RR2 are connected in series to a drain terminal of the NMOS transistor N3'.

Here, the NMOS transistor N1' of the replica unit 52 and the NMOS transistor N12 form a current mirror. A gate terminal of the NMOS transistor N1' of the replica unit 52 is connected to the gate terminal of the NMOS transistor N1 of the first stage 30. Accordingly, the NMOS transistor N1' of the replica unit 52 has the same gate voltage value VNBS as the NMOS N1 of the first stage 30. Accordingly, a current flowing through the NMOS N1' is the same as the current I flowing through the NMOS N12, and is the same as the current flowing through the NMOS transistor N1 when the NMOS transistor N2 is turned on by the clock signal CK in the first stage 30. In the replica unit 52, the resistors RR1 and RR2 divide, e.g., halve, a voltage applied to the resistor R1 of the first stage 30, so that a resulting divided voltage DBIAS' is output. The resulting output voltage DBIAS' is supplied as the reference voltage DBIAS of the first stage 30 of FIG. 3. Therefore, the reference voltage DBIAS can be set to the intermediate value of an input signal.

As described above, according to the present invention, by replicating predetermined internal circuits of a CML DFF used in a device, such as a frequency divider, and supplying a reference voltage to the CML DFF output from the replicated devices, it is possible to supply a corresponding reference voltage even when manufacturing tolerances arise due to changes in a manufacturing process. Therefore, the reference voltage DBIAS can always be set to the intermediate value of an input signal. In particular, the values of the resistors define a predetermined ratio, e.g., a ratio less than one, e.g., 1/2, that multiplies the voltage applied thereto, to ensure a value of the voltage DBIAS' supplied as the reference voltage DBIAS to the device remains between that of the input signals DA and DB.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A reference voltage generator, which supplies a reference voltage to a device that decides first and second output levels to input signals according to the reference voltage and latches the decided first and second output levels, the reference voltage generator comprising:

a reference current unit through which a reference current flows; and a replica unit including
   an input terminal connected to the reference current unit, and
   an output terminal connected to the device, the output terminal including a replicated circuit that replicates a circuit in the device that decides the first output level,
   wherein the replica unit multiplies the first output level from the replicated circuit output in response to the reference current by a predetermined ratio and outputs a result as the reference voltage to the device.

2. The reference voltage generator as claimed in claim 1, wherein the reference current unit comprises:
   a current controller for receiving a predetermined voltage and for outputting a current value;
   a current mirror, a first side of the current mirror being connected to the current controller; and
   a first transistor including a drain terminal, a source terminal, and a gate terminal, wherein the drain terminal is connected to the gate terminal and to a second side of the current mirror, and the current value flows into the drain terminal.

3. The reference voltage generator as claimed in claim 2, wherein the current controller comprises:
   an operational amplifier having a plus terminal and a minus terminal, the operational amplifier receiving the predetermined voltage through the plus terminal and amplifying a voltage difference between the plus terminal and the minus terminal;
   a second transistor including a drain terminal, a source terminal, and a gate terminal, wherein the second transistor turns on/off according to an output from the operational amplifier and wherein the gate terminal is connected to the operational amplifier, the drain terminal is connected to the current mirror, and the source terminal is connected to the minus terminal of the operational amplifier; and
   a resistor connected to the source terminal of the second transistor.

4. The reference voltage generator as claimed in claim 1, wherein the predetermined ratio is less than one.

5. The reference voltage generator as claimed in claim 4, wherein the predetermined ratio is 1/2.

6. The reference voltage generator as claimed in claim 2, wherein the replica unit comprises:
   a fourth transistor including a drain terminal, a source terminal, and a gate terminal, wherein the source terminal of the fourth transistor is grounded, the gate terminal of the fourth transistor is connected to the gate terminal of the first transistor and a gate terminal of a third transistor located at a corresponding gate position to the fourth transistor in the circuit within the device;
   fifth and sixth transistors, each including a drain terminal, a source terminal, and a gate terminal, wherein the fifth and sixth transistors are connected in series to the drain terminal of the fourth transistor, and each gate terminal of the fifth and sixth transistors is connected to a voltage which enables the fifth and sixth transistors to be turned on; and
   two resistors, which are connected in series to a non-connected drain terminal between the fifth and the sixth transistors, the two resistors for dividing the first output level from the replicated circuit by an inverse of the predetermined ratio.

7. A method of supplying a reference voltage to a device, which decides first and second output levels to input signals according to the reference voltage and latches the decided first and the second output levels, the method comprising:
   setting a reference current;
   replicating a circuit of the device that decides the first output level from the device, thereby forming a replicated circuit;
   replicating the reference current, thereby outputting a replicated reference current;
   supplying the replicated reference current to the replicated circuit; and
   multiplying the first output level from the replicated circuit by a predetermined ratio and supplying a result as the reference voltage to the device.

8. The method as claimed in claim 7, wherein setting the reference current comprises:
   controlling a current value using a predetermined voltage, thereby outputting a controlled current value;
   replicating the controlled current value through a current mirror; and
   connecting a drain terminal to a gate terminal and the current mirror, using a transistor including the drain terminal, a source terminal, and the gate terminal, so that the replicated current flows to the transistor.

9. The method as claimed in claim 8, wherein replicating the reference current and flowing the replicated current to the replicated circuit are performed by connecting the replicated circuit to the gate terminal of the transistor.

10. The method as claimed in claim 7, wherein the predetermined ratio is less than one.

11. The method as claimed in claim 10, wherein the predetermined ratio is 1/2.

12. A reference voltage generator, which supplies a reference voltage to a device that decides first and second output levels to input signals according to the reference voltage and latches the decided first and second output levels, the reference voltage generator comprising:
   means for setting a reference current;
   means for replicating a circuit of the device that decides the first output level from the device, thereby forming a replicated circuit;
   means for replicating the reference current and for outputting a replicated reference current;
   means for supplying the replicated reference current to the replicated circuit; and
   means for multiplying the first output level from the replicated circuit by a predetermined ratio and supplying a result as the reference voltage to the device.

13. The reference voltage generator as claimed in claim 12, wherein the means for setting the reference current comprises:
   means for controlling a current value using a predetermined voltage, thereby outputting a controlled current value;
   means for replicating the controlled current value through a current mirror; and
   means for connecting a drain terminal to a gate terminal and the current mirror, using a transistor including the drain terminal, a source terminal, and the gate terminal, so that the replicated current flows to the transistor.

14. The reference voltage generator as claimed in claim 13, wherein the means for replicating the reference current and flowing the replicated current to the replicated circuit include means for connecting the replicated circuit to the gate terminal of the transistor.

15. The reference voltage generator as claimed in claim 12, wherein the predetermined ratio is less than one.

16. The reference voltage generator as claimed in claim 12, wherein the predetermined ratio is 1/2.

* * * * *